United States Patent [19]
Lee

[11] Patent Number: 5,936,561
[45] Date of Patent: *Aug. 10, 1999

[54] APPARATUS AND METHODS FOR DIGITALLY COMPENSATED MULTI-BIT SIGMA-DELTA ANALOG-TO-DIGITAL CONVERSION

[75] Inventor: Seong-Ho Lee, Fullerton, Calif.

[73] Assignee: Samsung Electronics, Co. Ltd., Suwon, Rep. of Korea

[*] Notice: This patent is subject to a terminal disclaimer.

[21] Appl. No.: 08/772,458

[22] Filed: Dec. 23, 1996

[30] Foreign Application Priority Data

Dec. 23, 1995 [KR] Rep. of Korea .................. 95-55601

[51] Int. Cl.[6] .................................................. H03M 1/10
[52] U.S. Cl. ............................................ 341/143; 341/118
[58] Field of Search .................................. 341/143, 118, 341/120, 142, 122, 110, 144, 155

[56] References Cited

U.S. PATENT DOCUMENTS

| | | | |
|---|---|---|---|
| 4,612,533 | 9/1986 | Evans | 340/347 |
| 4,903,023 | 2/1990 | Evans et al. | 341/120 |
| 4,908,621 | 3/1990 | Polonio et al. | 341/120 |
| 5,017,920 | 5/1991 | French | 341/163 |
| 5,047,772 | 9/1991 | Ribner | 341/156 |
| 5,381,148 | 1/1995 | Mueck et al. | 341/139 |
| 5,635,937 | 6/1997 | Lim et al. | 341/161 |

OTHER PUBLICATIONS

Sarhang–Nejad et al., "*A High–Resolution Multibit EΔ ADC with Digital Correction and Relaxed Amplifier Requirements*", IEEE Journal of Solid–State Circuits, vol. 28, No 6, Jun. 1993, pp. 648–660.

Cataltepe et al., "*Digitally Corrected Multi–Bit EΔ Data Converters*", IEEE Proc. ISCAS '89, May 1989, pp. 647–650.

Larson et al., "*Multibit Oversampled EΔA/D Convertor With Digital Error Correction*", Electron, Lett., vol. 24, Aug. 1988, pp. 1051–1052.

Walden et al., "*Architectures for High–Order Multibit EΔ Modulators*", IEEE Proc. ISCAS '90, pp. 895–898.

*Primary Examiner*—Marc S. Hoff
*Assistant Examiner*—Peguy Jean Pierre
*Attorney, Agent, or Firm*—Marger Johnson & McCollom, P.C.

[57] ABSTRACT

A digitally compensated multi-bit sigma-delta analog-to-digital converter may be used to achieve high resolution in analog-to-digital conversions using a low oversampling ratio and simplified hardware construction. The digitally compensated multi-bit sigma-delta analog-to-digital converter has a recycling converter which converts an analog signal to a digital signal and which recycles the converted signal at least one time through a sample hold circuit, an analog-to-digital converter and a digital-to-analog converter in order to obtain a 4 bit digital signal. A digital corrector converts the 4 bit digital signal to a 16 bit corrected digital signal. The 16 bit corrected digital signal is used to generate a digitally compensated digital signal and to generate a digital error code. The digitally compensated digital signal is obtained by adding the 16 bit corrected digital signal with a 16 bit calibrated digital signal using an adder. The nine least significant bits of the compensated digital signal, representing a calibration value indicative of the error in the converted digital signal, are obtained using a roundoff circuit and stored in memory. As a result, high resolution in analog-to-digital conversion can be obtained while achieving a low oversampling ratio and simplified hardware construction.

18 Claims, 3 Drawing Sheets

APPARATUS AND METHODS FOR DIGITALLY COMPENSATED MULTI-BIT SIGMA-DELTA ANALOG-TO-DIGITAL CONVERSION

FIELD OF THE INVENTION

This invention relates to analog-to-digital converters, and more particularly, to sigma-delta analog-to-digital converters.

BACKGROUND OF THE INVENTION

Analog-to-digital conversion refers to the process of converting an analog signal into a digital signal. The conversion of analog signals to digital signals is often used in order to interface real world systems, many of which monitor continuously varying analog signals, with digital systems that read, store, interpret, manipulate and otherwise process the values corresponding to the analog signals. Similarly, digital-to-analog conversion refers to the process of converting digital signals into a continuous range of analog signals. Real world applications which use analog-to-digital converters include, for example, digital audio systems such as compact disc players, digital audio tape players, mini-disc players and various other high performance audio applications, which include conversion of audio frequency bands at a high resolution. By way of further example, a wide variety of digital signal processing applications also utilize analog-to-digital converters.

The efficiency and performance of analog-to-digital converters ("A/D converter(s)") and digital-to-analog converters ("D/A converter(s)") may be effected by a number of factors including resolution, sampling rate, speed and linearity. "Resolution" of an A/D converter refers to the smallest change in voltage that can be detected by the converter and that can produce a change in the digital code. With respect to D/A converters, resolution refers to the smallest change in the output analog signal. The resolution of a converter generally determines the total number of digital codes, or quantization levels, that may be recognized or produced by the converter or the circuit implementing the converter. The resolution of a D/A converter or an A/D converter may be specified in terms of the number of bits in the digital signal or in terms of the least significant bit of the system.

The "speed" of a D/A converter or an A/D converter may be determined by the time it takes to perform the conversion process. The speed is specified as the "settling time" when referring to D/A converters, and is specified as the "conversion time" when referring to A/D converters. The settling time for D/A converters may vary depending upon supply voltage and transition in the digital code.

"Sampling rate" of a converter refers to the number of times per second that the analog signal can be sampled and converted into a digital code by an A/D converter. A/D converters generally have a minimum sampling rate of at least two times the highest frequency of the analog signal being sampled. "Oversampling" refers to a converter which uses a sampling rate of N times a rate that is equivalent to twice the highest frequency in the analog signal, where N typically may range from between 2 to 64.

Finally, "linearity" represents the measurement accuracy of the converter. A number of different types of linearity exist. For example, "integral" linearity, which may also be referred to as "relative accuracy," is a measure of linearity over the entire conversion range. A second type of linearity is "differential" linearity which represents the linearity between code transitions and is a measure of the monotonicity of the converter. A converter is sometimes said to be monotonic if increasing input values result in increasing output values.

As previously mentioned, very high resolution digital audio or video systems often use specialized A/D converters or techniques for converting analog signals to digital signals as, for example, in compact disc applications. Although only a maximum base band frequency of approximately 20 kHz is generally used for systems like compact disc systems, a high resolution in the range of 16 to 18 bits is often used. Achievement of such a high resolution is generally difficult using very large scale integrated circuit ("VLSI") technologies absent the implementation of external trimming. As a result, sigma-delta A/D converters often are used when a higher resolution is required. Sigma-delta A/D converters provide for oversampling A/D conversion through the sampling of signals at very high frequencies. In other words, the combination of oversampling and noise shaping technologies may be implemented using a sigma-delta A/D converter in order to achieve a high resolution without external trimming.

Referring to FIG. 1, a block diagram is shown illustrating a conventional multi-bit sigma-delta A/D converter. The conventional multi-bit sigma-delta A/D converter illustrated in FIG. 1 includes 4 bit counter 10, 4 bit D/A converter 12, adder 14, sampling circuit 16, 4 bit A/D converter 18, and select circuit 20. In addition, the multi-bit sigma-delta A/D converter shown in FIG. 1 also includes decimation filter 22, an 18 bit full adder 24 and memory 26 which may be in the form of random access memory. The conversion process implemented by the multi-bit sigma-delta A/D converter illustrated in FIG. 1 begins with counter 10 counting the signals of the input clock CLK. The counter signals, and digital representation, are converted by the 4 bit D/A converter 12 to an analog signal which forms one of the inputs to adder 14. The other input to adder 14 is a reference signal obtained from the select circuit 20.

Sampling circuit 16 samples the output from adder 14 and generates a sampled analog signal. The sampled analog signal is converted by the 4 bit A/D converter 18 to a 4 bit digital signal. Thereafter, the multi-bit sigma-delta A/D converter of FIG. 1 identifies the most significant bit ("MSB") and provides the most significant bit of the digital signal as input to select circuit 20 and decimation filter 22. The most significant bit of the digital signal is used by select circuit 20 to select a positive reference signal (i.e., Vref+) or a negative reference signal (i.e., Vref−). The output of select circuit 20 then forms one of the inputs to adder 14.

The MSB of the digital signal generated by A/D converter 18 is filtered by decimation filter 22 to generate an 18 bit digital signal which is then combined with the 4 bit output from counter 10 using an 18 bit full adder 24 to generate a 10 bit digital signal. This is accomplished by full adder 24 through the subtraction of the 4 bit digital signal generated by counter 10 from the 18 bit digital signal generated by decimation filter 22. The resulting 10 bit digital signal represents the error code or data. This error code or data is stored in memory 26 at the address corresponding to the 4 bit digital signal generated by counter 10 upon a write control signal WR.

Sigma-delta A/D converters generally include a 1 bit analog-to-digital converter and a 1 bit digital-to-analog converter. The inclusion of the 1 bit A/D converter and a 1 bit D/A converter may assist in addressing many of the problems associated with linearity. However, a 1 bit sigma-delta A/D converter generally must increase its oversampling ratio from 64 times up to as much as 256 times and use a second order or higher cascade. As a result of the increase of the oversampling ratio and/or use of a higher order cascade, the clock frequency of the decimation filter may be raised from as little as 256 Fs to 512 Fs and an increase in current consumption may also be required. Still further, stabilization of a modulator in the sigma-delta A/D converter may occur. As a result, special requirements may be necessary in calculating any filter co-efficient for the modulator. Still further, since the multi-bit sigma-delta A/D converter uses an internal 1 bit sigma-delta A/D converter to calibrate the non-linearity of the D/A converter, a decimation filter may also be needed in order to provide calibration. In addition, a high oversampling ratio of between 128 Fs and 256 Fs may be required since a fast clock is generally used to obtain sufficiently accurate error data.

The design and operation of various A/D converters are described in detail in chapter 31 of the textbook entitled "The Electrical Engineering Handbook" edited by Dorf, CRC Press, Inc. (1993); the article entitled "A High Resolution Multi-Bit ΣΔ ADC With Digital Correction and Relaxed Amplifier Requirements," Sarhang-Nejad and Temes, IEEE Journal of Solid-State Circuits, Volume 28, No. 6, pages 648–660 (June 1993); the article entitled "Digitally Corrected Multi-Bit ΣΔ Data Converters," Cataltepe, et al., IEEE Proceedings of ISCAS '89, pages 647–650 (May 1989); the article entitled "Multi Bit Oversampled Σ-Δ A/D Converter With Digital Error Correction," Larson et al., Electronic Letters, Volume 24, pages 1051–52 (August 1988); and the article entitled "Architectures For High Order Multi-Bit ΣΔ Modulators," IEEE Proceedings of ISCAS '90, pages 895–898 (May 1990).

In addition to the sigma-delta A/D converter described above, other alternatives exist which may achieve the goal of high resolution. Examples of these other alternatives include a trimming process, a random aging process and an averaging process. However, in these alternatives, the analog or digital circuitry may become very complicated.

Unfortunately, these prior art alternatives may still produce problems of their own. For example, the increased complexity of the circuitry may cause problems with linearity, as well as increases in oversampling ratios, stabilization and noise.

SUMMARY OF THE INVENTION

It is, therefore, an object of the present invention to provide apparatus and methods for achieving a relatively high resolution in analog-to-digital conversion which can use a low oversampling ratio and a simplified hardware construction.

This and other objects are provided according to the present invention by digitally compensated multi-bit sigma-delta A/D converters. Digitally compensated multi-bit sigma-delta A/D converters according to the present invention convert an analog signal to a digital signal by recycling the signal, digitally correct the recycled digital signal and digitally calibrates the digital signal in order to generate a digitally compensated digital signal and a digital error code. Recycling converters according to the present invention include a sample hold circuit which samples an analog input signal in order to obtain a sampled analog signal, an analog-to-digital converter which converts the sampled analog signal to a digital signal, and a multi-bit digital-to-analog converter which reconstructs the analog signal from the digital signal. The reconstructed analog signal is recycled back through these components at least one time.

The digital calibrator according to the present invention provides a digitally calibrated digital signal, and combines the digitally calibrated digital signal with the digitally corrected digital signal using an adder. The 16 bit output from the adder may be continually cycled as input into the adder to be combined with the next digitally corrected digital signal and at the same time may be rounded off to obtain a calibration value or "error" data. The present invention stores the 9 bit calibration value in memory at an address corresponding to the four most significant bits of the digitally corrected digital signal.

The sample hold circuit, the analog-to-digital converter and the register, which temporarily stores the output from the adder, preferably operate in response to the same signal from the same clock.

DESCRIPTION OF THE PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein. Rather, this embodiment is provided so that this disclosure will be thorough and complete, and will fully convey the scope of the invention of those skilled in the art. Like numbers refer to like elements throughout.

Figure 1:
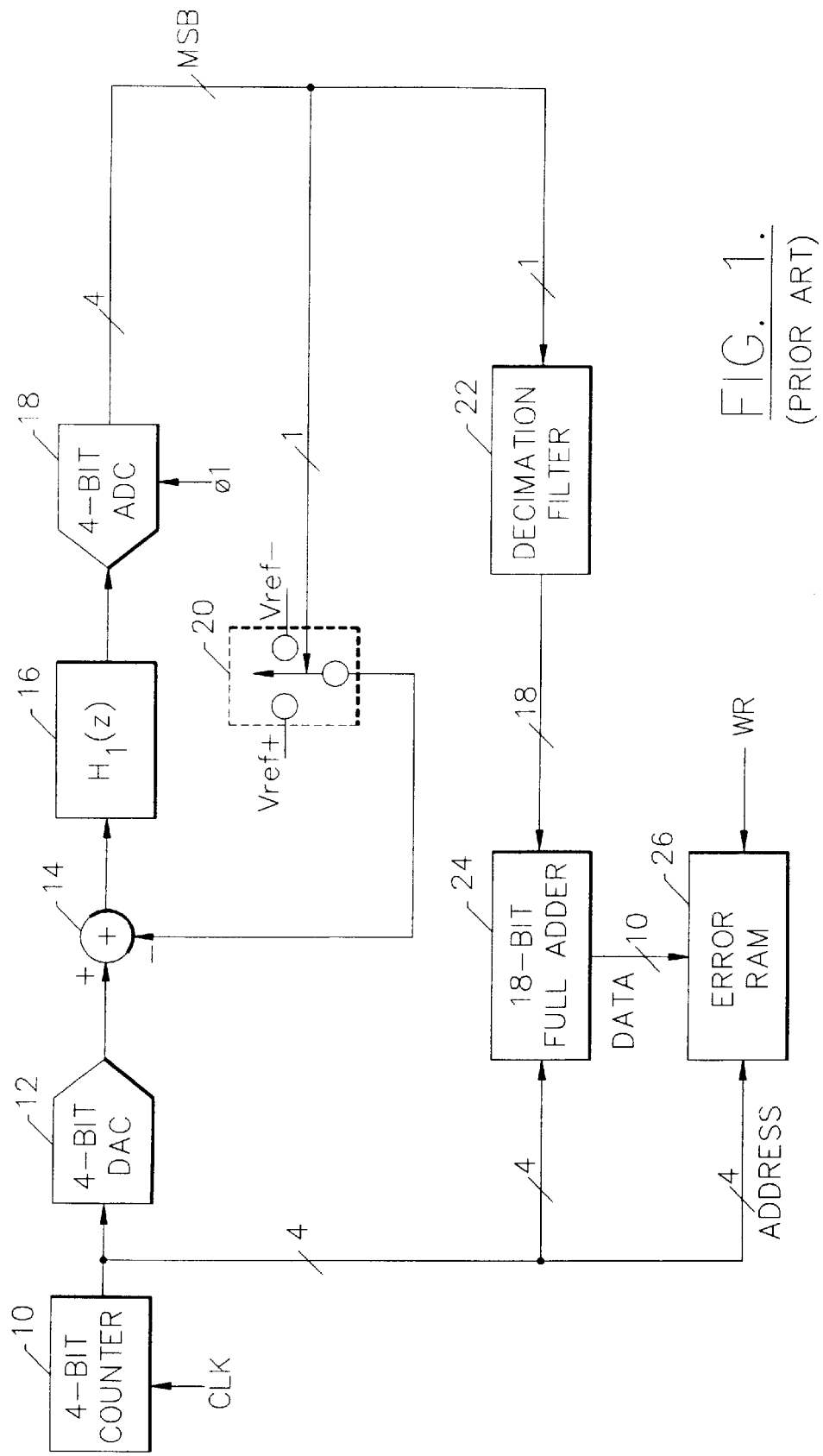
FIG. 1 is a block diagram of a conventional multi-bit sigma-delta analog-to-digital converter.
Figure 2:
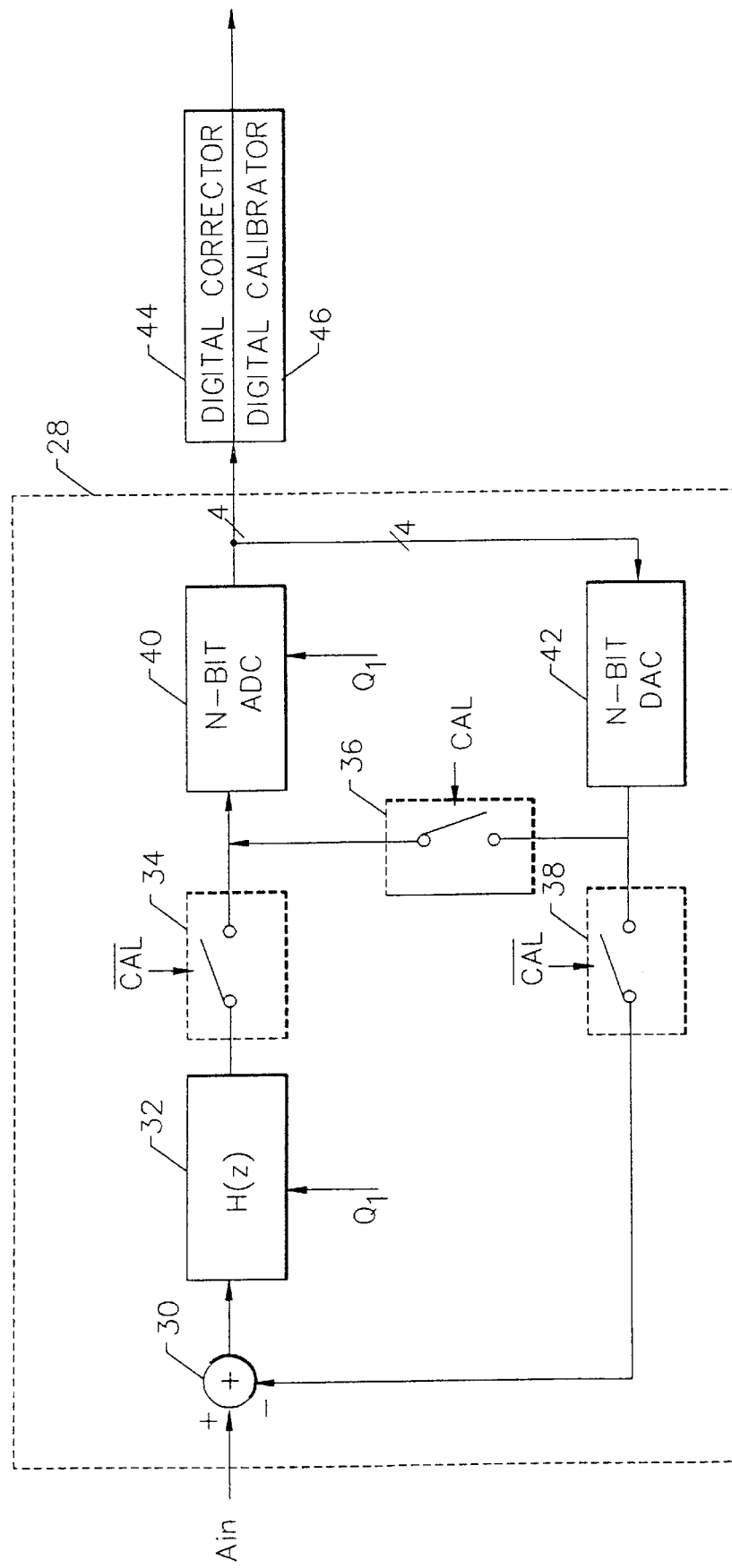
FIG. 2 is a block diagram of a digitally compensated multi-bit sigma-delta analog-to-delta converter according to the present invention.

Referring now to FIG. 2, the digitally compensated multi-bit sigma-delta A/D converter according to the present invention will now be described. A multi-bit sigma-delta A/D converter according to the present invention includes recycling converter 28, digital corrector 44 and digital calibrator 46. The recycling converter 28 includes adder 30, sample hold circuit 32, first switching circuit 34, second switching circuit 36, third switching circuit 38, an N-bit A/D converter 40 and an N-bit D/A converter 42. Essentially, the recycling converter 28 obtains a sampled analog signal, converts the sampled analog signal to a digital signal, reconstructs the original analog signal from the digital signal, and recycles the reconstructed analog signal by adding it to the next analog input signal to recycle the digital signal.

More particularly, an analog input signal $A_{in}$ serves as one of the inputs to adder 30. The analog input signal is sampled by sample hold circuit 32 in order to obtain a sampled analog signal. First switching circuit 34, which is activated by a calibrated control signal $\overline{CAL}$, controls the passing of the sampled analog signal from sample hold circuit 32 to the N-bit A/D converter 40. When the calibrated control signal $\overline{CAL}$ has a logic value of "low" (i.e., "0"), the first switching circuit 34 is closed, allowing the sampled analog signal to be input to N-bit A/D converter 40. The N-bit A/D converter 40 converts the sampled analog signal to a digital signal. The digital signal output of N-bit A/D converter 40 is transferred to digital correction 44 and digital calibration 46 and also to N-bit D/A converter 42 for recycling. In the preferred embodiment, the N-bit A/D converter 40 and the N-bit D/A converter 42 are 4 bit converters.

N-bit D/A converter 42 uses the newly obtained digital signal to reconstruct the original analog signal. Thereafter, the reconstructed analog signal is fed back into the N-bit A/D converter 40 and adder 30 under the control of second switching circuit 36 and third switching circuit 38, respectively. When the calibrated control signal CAL has a logic value of "low," the reconstructed analog signal becomes an input into and adder 30. Adder 30 adds the reconstructed analog signal to the analog input signal $A_{in}$, and passes the result to sample hold circuit 32.

Figure 3:
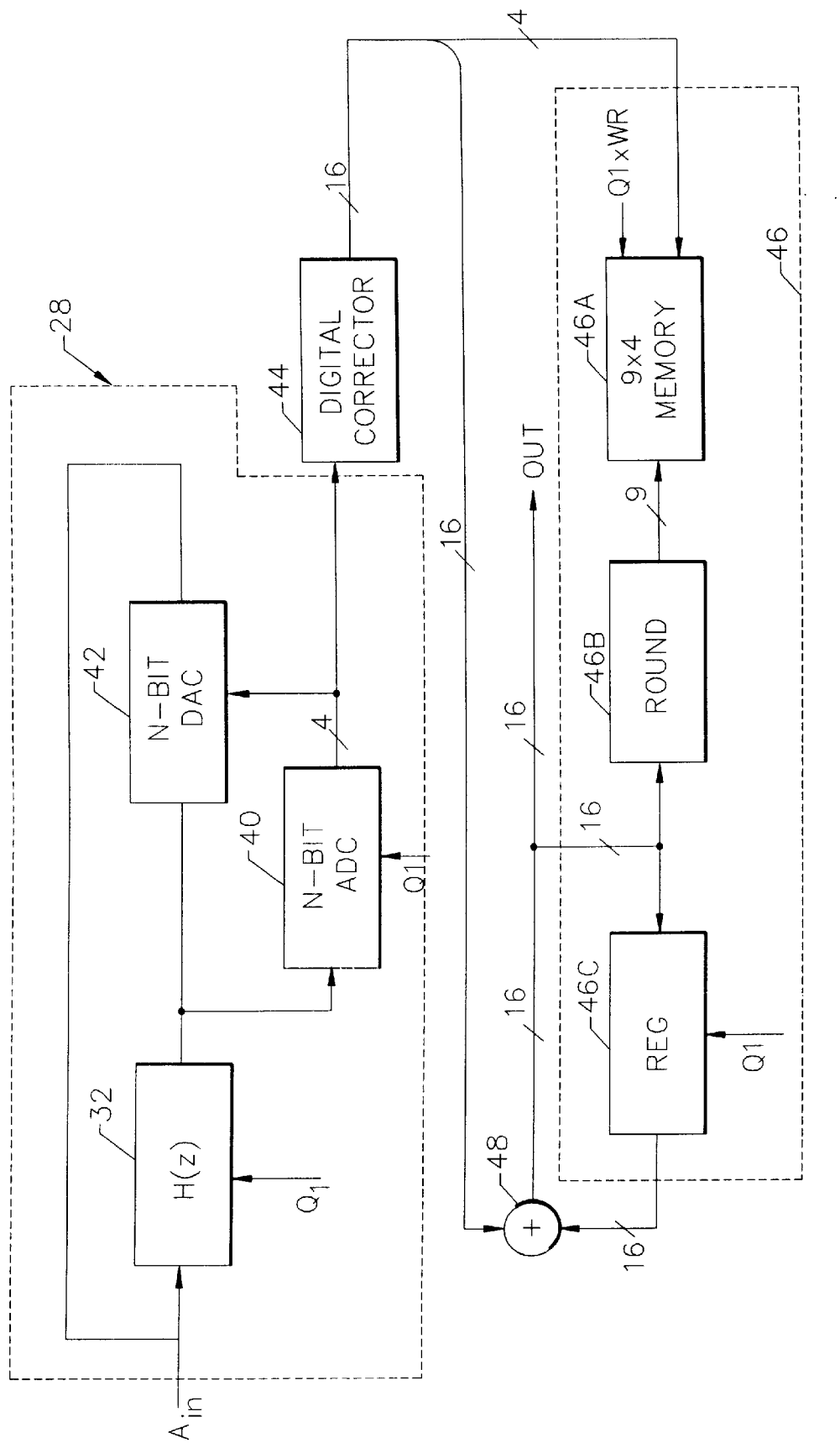
FIG. 3 is a detailed block diagram of a digitally compensated multi-bit sigma-delta analog-to-digital converter further illustrating the clocking signals, the digital corrector and the digital calibrator according to the present invention.

Referring now to FIG. 3, the recycling converter described with reference to FIG. 2 and illustrated generally at 28 is provided in FIG. 3 for the purpose of illustrating the clocking signals Q1. Sample hold circuit 32 obtains a sample of the analog input signal $A_{in}$ in response to clock signal Q1 having a logic value of "high" (i.e., "1"). Sample hold circuit 32 holds the sampled analog signal when the clock signal 21 drops to a logic value of "low." Thereafter, the A/D converter 40 converts the analog signal to a 4 bit digital signal when the clock signal Q1 has a logic value of "high." The 4 bit digital signal output from A/D converter 40 is used as input to digital correction 44 and as input to D/A converter 42. D/A converter 42 is a multi-bit D/A converter which reconstructs the analog signal originally obtained by the sample hold circuit 32 from the 4 bit digital signal generated by A/D converter 40. The analog signal which is reconstructed by the D/A converter 42 is then recycled through recycling converter 28 by using the reconstructed analog signal as an input to sample hold circuit 32 and also as an input to A/D converter 40.

Still referring to FIG. 3, the digital corrector 44 and digital calibrator 46 will now be described. Digital corrector 44, using the 4 bit recycled digital signal generated by A/D converter 40, converts the 4 bit recycled digital signal to a 16 bit corrected digital signal. The 16 bit corrected digital signal is used as an input to adder 48 and as an address for memory 46a. All 16 bits of the corrected digital signal are used as input to adder 48. Only the four most significant bits of the 16 bit corrected digital signal are used as an address for memory 46a. Adder 48 adds the 16 bit corrected digital signal to a 16 bit calibrated digital signal provided by digital calibrator 46 to generate a 16 bit compensated digital signal.

The digital calibrator 46 includes a 9×4 memory 46a, rounder 46b and register 46c. The adder 48 and digital calibrator 46 may be collectively referred to as a digital calibrator. The 16 bit compensated digital signal generated by adder 48 is the output of the digitally compensated multi-bit analog-to-digital converter as indicated at "OUT." In addition, the compensated digital signal is recycled back through adder 48 to be added to the next 16 bit corrected digital signal generated by digital corrector 44. The 16 bit compensated digital signal is stored in register 46c until clock signal Q1 has a logical value of "high," and then the 16 bit compensated digital signal forms an input to adder 48 to be combined with the 16 bit digitally corrected signal from digital corrector 44.

In addition, the 16 bit compensated signal is rounded off by roundoff circuit 46b to obtain a 9 bit calibrated value. The 9 bit calibrated value generated by roundoff circuit 46b is then stored in memory 46a in response to a write command WR and the clock signal Q1 having a logic value of "high" at an address in memory 46a corresponding to the four most significant bits of the 16 bit corrected digital signal generated by digital corrector 44.

Many different types of converters may be used for the N-bit A/D converter 40. In the preferred embodiment, A/D converter 40 is a "flash" type converter. Sample hold circuit 32 may use a final stage of a second or higher order switching capacitor filter. Also in the preferred embodiment, a capacitor array may be constructed in the 4 bit D/A converter 42 by a binary waiting process. Construction of a capacitor array in D/A converter 42 may serve to reduce the size of the calibration memory 46a by a factor of ½ as compared with that of a unit array. Still further, memory 46a is preferably a static random access memory (SRAM).

If the capacitor mismatching is ±0.4%, the nine least significant bits obtained by roundoff circuit 46b correspond to the number of effective bits.

During operation in the preferred embodiment, the error between the capacitors of the capacitor array in D/A converter 42 are recycled three times through recycling converting means 28. In other words, the analog signal is cycled through sample hold circuit 32, A/D converter 40 and D/A converter 42 three times before the 4 bit recycled digital signal is passed through to digital corrector 44. Digital corrector 44 then converts the 4 bit recycled digital signal to a 16 bit corrected digital signal representing a 16 bit error code. The 16 bit error code is accumulated through adder 48 and register 46c. The nine least significant bits of the accumulated (i.e., digitally compensated) error code output by adder 48 are obtained by roundoff circuit 46b and stored in memory 46a.

The outputs of various stages of the digitally compensated multi-bit sigma-delta analog-to-digital converter may be applied to various other circuit components. For example, the 9 bit calibration value may be subtracted from the output of the 4 bit A/D converter using the 16 bit adder 48 and thereafter applied to a decimation filter (not shown). The decimation filter may be a multi-bit type decimation filter. If the decimation filter is multi-bit, a 16 bit error code may be generated. If the decimation filter is a multiplier tree structure (e.g., sync filter), a 4 bit error code may be generated using a digital modulator. In addition, a modulator (not shown) may be used. A setting time of an operational amplifier constituting a low pass filter of the modulator can be reduced from 256 Fs to 16 Fs. This reduction results in a reduction in power consumption. Neither the decimation filter nor the modulator are required. As a result, hardware construction complexity, time and cost are reduced since decimation filters are modulators are not required.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A digitally compensated multi-bit analog-to-digital converter comprising:

recycling converter means for repeatedly converting to a digital signal the difference between an input analog signal and a reconstructed prior input analog signal, said reconstructed prior input analog signal comprising a prior input analog signal which has been converted to a digital signal and has been reconverted back to an analog signal to obtain a recycled digital signal;

a digital corrector which is responsive to said recycling converter means, and which digitally corrects said recycled digital signal to obtain a digitally corrected digital signal; and a digital calibrator which is responsive to said digital corrector, to generate a digitally compensated digital signal and to generate a digital error code, wherein said digital calibrator comprises:

a calibrating circuit which is responsive to said digital corrector, and which obtains a digitally calibrated digital signal; and a combiner which combines the digitally calibrated digital signal and the digitally corrected digital signal to generate a digitally compensated digital signal; and a rounder which is responsive to said combiner, and which generates a digital error code.

2. A digitally compensated multi-bit analog-to-digital converter according to claim 1 further comprising a clock, and wherein said recycling converter means and said digital calibrator are responsive to said clock.

3. A digitally compensated multi-bit analog-to-digital converter according to claim 1 wherein said recycling converter means comprises:

a sample-hold circuit which samples an analog input signal to obtain a sampled analog signal;

an analog-to-digital converter which is responsive to said sample-hold circuit, and which converts the sampled analog signal to a digital signal;

a multi-bit digital-to-analog converter which is responsive to said analog-to-digital converter, and which generates a reconstructed analog signal from said digital signal; and an adder which adds said reconstructed analog signal to said analog input signal.

4. A digitally compensated multi-bit analog-to-digital converter according to claim 3 wherein said analog-to-digital converter is a flash type analog-to-digital converter.

5. A digitally compensated multi-bit analog-to-digital converter according to claim 1 wherein said digital calibrator further comprises a memory which stores the digital error code.

6. A digitally compensated multi-bit analog-to-digital converter according to claim 1 wherein said combiner comprises an adder which adds the digitally calibrated digital signal and the digitally corrected digital signal to generate a digitally compensated digital signal, and a register which stores the digitally compensated digital signal.

7. A digitally compensated multi-bit analog-to-digital converter according to claim 1 wherein said digitally compensated multi-bit analog-to-digital converter is a sigma-delta analog-to-digital converter.

8. A digitally compensated multi-bit analog-to-digital converter according to claim 1, wherein said recycling converter means comprises means for repeatedly converting a first analog signal to a digital signal, converting the digital signal to a first generated analog signal which is subtracted from the first analog signal to provide a summed analog signal which is converted to a second digital signal which is converted to a second generated analog signal which is summed with the first analog signal to provide a second summed analog signal which is converted to a digital signal to obtain said recycled digital signal.

9. A digitally compensated multi-bit sigma-delta analog-to-digital converter comprising:

a sample-hold circuit which samples the difference between an input signal and a re-constructed analog signal at a first clock, which holds the sampled input signal at a second clock signal and which outputs the sampled difference between the input signal and the re-constructed analog signal;

an analog-to-digital converter which receives the output of said sample-hold circuit, and which converts the difference between the input signal and the re-constructed analog signal to a digital signal in response to the second clock signal;

a multi-bit digital-to-analog converter which receives the digital signal from the analog-to-digital converter, and which generates the re-constructed analog signal from said digital signal;

a digital corrector which is responsive to said analog-to-digital converter, to digitally correct said digital signal;

a digital calibrator which supplies a digitally calibrated digital signal corresponding to the digitally corrected digital signal; and an adding means which is responsive to said digital corrector and said digital calibrator, and which adds the digitally corrected digital signal to the digitally calibrated digital signal to generate a digitally compensated digital signal.

10. A digitally compensated multi-bit sigma-delta analog-to-digital converter according to claim 9 wherein said digital calibrator comprises:

a round-off circuit, which is responsive to said adder, and which generates a calibrated value by rounding off said digitally compensated digital signal;

a memory which stores the calibrated value in response to said digital correcter and in response to a write control signal; and a register which is responsive to said adder and the second clock signal, to store the digitally compensated digital signal.

11. A method for converting an analog signal to a digitally compensated multi-bit digital signal comprising the steps of:

repeatedly converting the difference between an analog input signal and a reconstructed analog signal to a digital signal to obtain a recycled digital signal;

digitally correcting said recycled digital signal to obtain a digitally corrected digital signal; and calibrating said digitally corrected digital signal to generate a digitally compensated digital signal and to generate a digital error code, wherein said calibrating step comprises the steps of:

obtaining a digitally calibrated digital signal;

combining the digitally calibrated digital signal and the digitally corrected digital signal to generate a digitally compensated digital signal; and rounding off the digitally compensated digital signal to generate a digital error code.

12. A method according to claim 11 further comprising the step of controlling said repeatedly converting step and said calibrating step with a clocking signal.

13. A method according to claim 11 wherein said repeatedly converting step comprises the steps of:

sampling an analog input signal to obtain a sampled analog signal;

converting the sampled analog signal to a digital signal;

converting the digital signal to a reconstructed analog signal; and adding said reconstructed analog signal to said analog input signal.

14. A method according to claim 13 wherein said sampled analog signal converting step utilizes a flash type analog-to-digital converter.

15. A method according to claim 11 wherein said calibrating step further comprises the step of storing the digital error code in a memory.

16. A method according to claim 11 wherein said combining step comprises the steps of adding the digitally calibrated digital signal and the digitally corrected digital signal to generate a digitally compensated digital signal and storing the digitally compensated digital signal in a register.

17. A method for converting an analog signal to a digitally compensated multi-bit digital signal comprising the steps of:

sampling a difference between an input analog signal and a re-constructed analog signal at a first clock signal;

holding the sampled difference between the input analog signal and the reconstructed analog signal at a second clock signal;

converting the held sampled difference between the input analog signal and the reconstructed analog signal to a digital signal in response to the second clock signal;

generating a reconstructed analog signal from said digital signal;

digitally correcting said digital signal to obtain a digitally corrected digital signal;

supplying a digitally calibrated digital signal corresponding to the digitally corrected digital signal; and adding the digitally corrected digital signal to the digitally calibrated digital signal to generate a digitally compensated digital signal.

18. A method according to claim 17 further comprising the steps of:

rounding off said digitally compensated digital signal to obtain a calibrated value;

storing the calibrated value in a memory; and storing the digitally compensated digital signal in a register.

* * * * *